United States Patent [19]

Gilker et al.

[11] Patent Number: 4,581,705

[45] Date of Patent: Apr. 8, 1986

[54] METHOD AND MACHINE FOR METERING ELECTRIC PARAMETERS

[75] Inventors: Clyde Gilker, So. Milwaukee; Naresh K. Nohria, Milwaukee, both of Wis.

[73] Assignee: Cooper Industries, Inc., Houston, Tex.

[21] Appl. No.: 461,751

[22] Filed: Jan. 28, 1983

[51] Int. Cl.$^4$ ............................................. G01R 21/06
[52] U.S. Cl. ...................................... 364/492; 364/483; 324/76 R
[58] Field of Search .................. 364/492, 483, 487; 324/76 R, 103 R; 340/646; 323/257

[56] References Cited

U.S. PATENT DOCUMENTS

| Re. 28,883 | 5/1976 | Dorey | 340/347 |
|---|---|---|---|
| 3,505,506 | 4/1970 | Kostalos, Jr. | 235/151 |
| 3,747,068 | 7/1978 | Bruner et al. | 340/151 |
| 3,911,359 | 10/1975 | Metcalf | 324/106 |
| 4,041,288 | 8/1977 | Conway et al. | 235/151 |
| 4,077,061 | 2/1978 | Johnston et al. | 364/483 |
| 4,125,895 | 11/1978 | Buhlmann | 364/483 |
| 4,142,146 | 2/1979 | Schumann et al. | 364/487 X |
| 4,229,795 | 10/1980 | Vieweg et al. | 364/483 |
| 4,236,217 | 11/1980 | Kennedy | 364/483 |
| 4,253,151 | 2/1981 | Bouve | 364/483 |
| 4,263,653 | 4/1981 | Mecklenburg | 364/483 |
| 4,272,816 | 6/1981 | Matsumoto | 364/483 |
| 4,291,376 | 9/1981 | McCahill | 364/483 |
| 4,356,553 | 10/1982 | Steinle et al. | 364/483 |
| 4,360,880 | 11/1982 | Brodie et al. | 364/483 |
| 4,365,302 | 12/1982 | Elms | 364/483 |
| 4,443,854 | 4/1984 | Pflanz et al. | 364/483 |

OTHER PUBLICATIONS

Electric Utility Engineering Reference Book vol. III Westinghouse Electric Corp. pp. 458–462.
Electric Engineering Circuits, H. H. Skilling 1957 pp. 404–445 K 300 Analyzed Load Meter, 3 pp. Bulletin 15110.
Sangamo Energy Management Div. 4/82; Dranetz 808, 2 pp. brochure, Dranetz Engineering Lab Inc.
Electric World, Jan. 1983, Electronic Meter Carves A Niche for Itself, pp. 119–126.
Electric World, Jan. 1983, Landis & Gyr Advertisement, pp. 58–59.

*Primary Examiner*—Edward J. Wise
*Attorney, Agent, or Firm*—Eddie E. Scott; Nelson A. Blish; Alan R. Thiele

[57] ABSTRACT

The electric parameter metering machine comprises electric parameter pickup circuitry for sensing the instantaneous analog amplitude value of a electric parameter waveform in at least one phase in an electric power distribution system at selected time intervals during each full cycle, an A/D converter for converting the analog amplitude values to digital signals and signal processing circuitry including a memory for storing the digital signals. The signal processing circuitry includes a microprocessor operable to apply a conventional waveform analysis technique to the digital signal information collected with respect to a selected number of cycles of the electric parameter waveform to obtain an instantaneous RMS value of the electric parameter and operable to process a sequence of instantaneous RMS electric parameter values at discrete time intervals to obtain time averaged or demand electric parameter values. A visual display device is coupled to the signal processing circuitry and a pushbutton control panel is coupled to the signal processing circuitry for enabling an operator to operate pushbuttons to provide a digital readout of either instantaneous RMS, demand, or peak demand values on the visual display device.

46 Claims, 6 Drawing Figures

FOUR DISPLAY FORMATS

I – INSTANTANEOUS
A – AVERAGE
P – PEAK

POWER SUPPLY 100

METHOD AND MACHINE FOR METERING ELECTRIC PARAMETERS

TECHNICAL FIELD

The present invention relates to a method and metering machine for use by electric utilities in monitoring instantaneous RMS, demand and peak demand values of electric parameters in various power lines. The present invention particularly relates to the metering of voltage, current and power of all phases of three phase high voltage, 2.4–30 kilovolt power line in a distribution system.

BACKGROUND ART

The electric parameters of voltage, current and power generally describe the varying state of a power line in a distribution system. Voltage and current vary sinusoidally at a generally constant power line frequency of 60 cycles in the United States. Power is a product of the voltage and current. While the amplitudes of voltage and current vary sinusoidally the root mean square (RMS) value of voltage is regulated to nearly a constant value. Current RMS fluctuates widely in response to loads being added or subtracted in the system. The nature of the load can cause the phase angle between the voltage and current to fluctuate and an attempt is made to regulate the phase angle fluctuation within bounds. The instantaneous RMS values of a electric parameter are not particularly useful in determining how hard distribution equipment is being worked. The limit of allowable work for most distribution equipment is generally determined by its heat dissipation ability. Distribution equipment has heat capacity allowing a piece of equipment to absorb energy for later dissipation. The absorption and dissipation of equipment in response to a change in power is exponential in nature. To appropriately monitor how hard distribution equipment is being worked, or the demand level, the metering device must respond to changes in power values exponentially. Given usual conditions, the level of demand is proportional to the demand value of current. In the following discussion, current is primarily used as the example of how demand is monitored.

Demand current is a parameter that utilities want to monitor since it tends to diminish the effects of short duration instantaneous RMS current excursions from the average RMS value of the current caused by switching loads and associated transients. The purpose is to measure current in such a way that the meter's registered value is a measure of load as it affects the heating (and therefore the load-carrying capacity) of the electrical equipment in a distribution system. Often lagged or demand current values are used in conjunction with voltage values to provide demand power. Demand power meters can indicate either real or reactive power or both real and reactive power. Also, of course, it is desirable to know what instantaneous RMS current is at any point in time.

Heretofore electromechanical meters known as thermal demand meters were utilized for determining demand current which is an exponentially averaged current having a selected time constant, showing the effects of the change in instantaneous RMS current as loads are switched on and off a line. The time constant is often selected so that 90% of a step change is registered in 15 miutes. The thermal demand meters use an element which moves when it is heated by current and this movement of the thermal element will approximate the exponential buildup of heat in power distribution equipment. Accordingly, for some time now, thermal demand meters have been utilized since the thermal expansion of the thermal element as it is heated by current causes it to mimic the generally exponential heating and cooling response of power distribution equipment.

Examples of demand meters and how they are utilized by electric utilities are described on pages 458–462 in the Electric Utility Engineering Reference Book entitled *Distribution Systems,* Vol. III, by Electric Utility Engineers of the Westinghouse Electric Corporation, East Pittsburgh, Pa.

Another demand meter is disclosed in the Sangamo Product Bulletin 10215 Effective April, 1982 entitled "K300 Analyzed Load Meter".

Other systems which make measurements of current, power, volts, amperes and, in some instances, demand current, are also disclosed in the following U.S. Patents:

| U.S. PAT. NO. | PATENTEE |
|---|---|
| 3,505,506 | J. Kostalos, Jr. |
| 3,747,068 | Bruner et al. |
| 3,911,359 | Metcalf |
| 4,041,288 | Conway et al. |
| 4,077,061 | Johnston et al. |
| 4,125,895 | Buhlmann |
| 4,229,795 | Vieweg et al |
| 4,236,217 | Kennedy |
| 4,253,151 | Bouve |
| 4,263,653 | Mecklenburg |
| 4,272,816 | Matsumoto |
| 4,291,376 | McCahill |
| 4,356,553 | Steinle et al. |
| Re. 28,706 | Dorey |

DISCLOSURE OF INVENTION

The current metering machine of the present invention differs from these prior art current, voltage and power measuring systems, referred to above, by providing a current metering machine which does not use a thermal element for evaluating or measuring demand current. Instead, analog samples of the current amplitude are digitized and processed in microprocessor means to provide instantaneous RMS current values which are futher processed to provide demand current values. Storage means, associated with the microprocessor, records present instantaneous RMS and demand current values and maintains a record of the maximum or peak demand current value. Line voltages generally fluctuate in a relatively narrow band about the nominal line voltage. It is therefore desirable and customary to maintain a record of the highest and lowest instantaneous RMS line voltages so that a utility can be aware of reoccurring consumer burn out and brown out problems. In contrast, minimum demand current is not normally maintained as a record since it need not be symptomatic of a consumer problem.

Digitized instantaneous current amplitutes are processed by microprocessor means to generate an instantaneous RMS current value of the line currents. This may be accomplished by determining the Fourier coefficients in a Fast Fourier Transform process. The instantaneous RMS current values are further manipulated within the microprocessor means to generate simulated thermal demand meter values. Simulated thermal demand meter values can be generated by employing a variety of algorithms which describe, or closely approach, exponential thermal responses and can be treated as demand current.

Further, as will be described in greater detail hereinafter, a control panel and visual display device are provided so that a readout can be obtained of instantaneous RMS current, demand current or peak demand current. Empirical tests have shown that the demand current determined using the microprocessor and the program therein for applying a quasi exponential algorithm provides essentially the same exponential curve that would be obtained by using a thermal demand meter or an exponential algorithm.

According to the invention there is provided a method for metering a electric parameter for example current comprising the steps of: sensing the instantaneous analog amplitude value of a current waveform in at least one phase in an electric power distribution system at selected time intervals during each full cycle; converting the analog amplitude values to digital amplitute signals; storing the digital amplitude signals in a memory in, or associated with, said signal processing circuitry to which the signals are supplied; applying a conventional waveform analysis technique to the digital amplitude signal information collected with respect to a selected number of cycles of the current waveform to obtain an instantaneous RMS value of the current; averaging with selected algorithms a sequence of instantaneous RMS current values at discrete time intervals to obtain time averaged or demand current values; storing the values of the instantaneous RMS and demand current and maintaining a record of the peak demand current value; and providing visual display means and control means coupled to the processing circuitry for enabling an operator to operate the control means to provide a readout of either the instantaneous RMS current, demand current or peak demand current.

Further according to the invention there is provided a current metering machine comprising: means for sensing the instantaneous analog amplitude value of a current waveform in at least one phase in an electric power distribution system at selected time intervals during each full cycle; means for converting the analog amplitude values to digital amplitude signals; signal processing circuitry including a memory for storing the digital amplitude signals and values derived therefrom, said signal processing circuitry being operable to apply a conventional waveform analysis technique to the digital amplitude signal information collected with respect to a selected number of cycles of the current waveform to obtain an instantaneous RMS value of the current and being operable to average with a selected algorithm, a sequence of instantaneous RMS current values at discrete time intervals to obtain a time averaged or demand current values; further being operable to determine the peak value of successive demand current values; and visual display means coupled to said signal processing circuitry and; control means coupled to said signal processing circuitry for enabling an operator to operate the control means to provide a digital readout of either the instantaneous RMS current, the demand current, or the peak demand current on said visual display.

BEST MODE FOR CARRYING OUT THE INVENTION

Figure 1:
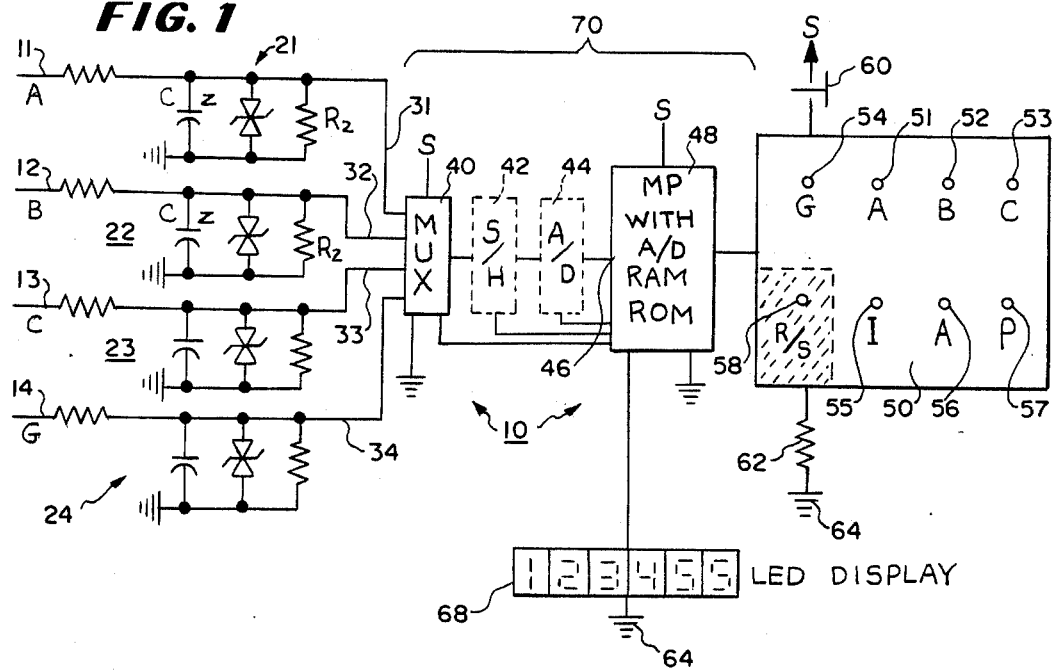
FIG. 1 is a schematic circuit diagram of the current measuring machine of the present invention.

Referring now to the drawings in greater detail there is illustrated in FIG. 1 a metering machine 10 constructed in accordance with the teachings of the present invention. The electric parameter metering machine shall first be discussed in terms of current. The current metering machine 10 is particularly adapted for use with a three phase high voltage power distribution system.

The machine 10 has four inputs 11, 12, 13 and 14 which are connected to conventional current pickup circuits such as the type that include a current transformer coupled to the power line, and a circuit coupled to the secondary winding of the current transformer which then has an output that is supplied to a respective one of the inputs 11, 12, 13, or 14. Such a system is isolated from the power line by the current transformers. Alternatively, the current pickup circuit can take various forms known in the art.

In one preferred embodiment of the current metering machine 10, it is contemplated that the inputs 11, 12, 13 and 14 would be coupled to the phase current pickup and sensing circuits in a recloser control circuit such as those shown in U.S. Pat. Nos. 3,100,854 or 3,405,318. Such recloser circuits are adapted to sense the phase currents flowing in the line and when there is a fault current sensed, the recloser opens to open circuit the power line and then recloses after a short period of time to see if the fault has been removed from the line whereby power can be restored. In such a recloser control circuit, AC phase current is sensed and supplied to one of the inputs, e.g., input 11, of the current metering machine 10. As shown, it is assumed that this is phase A of a three phase system having phases A, B and C. Then, input 12 for phase B is connected to the current pickup circuit in a recloser control circuit for phase B of the power distribution system. Likewise, input 13 is connected to the current pickup circuit in a recloser control circuit for phase C and finally, input 14 is connected to the current pickup circuit in a recloser control circuit for the ground phase G. The present invention is of course suitable for use with other power distribution equipment such as voltage regulator controls.

The current signals supplied to each of the inputs 11–14 are passed through a long term overload and transients protection circuit 21, 22, 23 or 24 as shown. Each of these protection circuits 21–24 includes a first resistor $R_1$, a capacitor C, a double ZENER diode Z and a second resistor $R_2$ connected as shown. The current signals are filtered by the $R_1$, C combination, having a time constant of about 1 millisecond, to prevent transient voltages from being imposed on other components of the current metering machine 10. The breakover voltage of the ZENER diode should be selected to be about equal to the bus voltage of the other components of current metering machine 10 to protect them against longer duration overvoltages.

Each of the protection circuits 21-24 has an output 31-34 which is fed to a multiplexer 40. Multiplexer 40 selectively passes one of the amplitude signals to the sample and hold circuit 42. The sample and hold circuit 42 selectively samples the amplitude signal at difference points during each cycle. The analog sample of the amplitude signal is then held for a preselected period of time and is the output of the sample and hold 42 circuit. The output from the sample and hold circuit 42 is then fed to an A/D converter 44 where the analog value is converted to a digital amplitude value. This digital amplitude value is presented to an input 46 of microprocessor 48. Such microprocesor 48 has connected thereto or associated therewith random access memory and read only memory. The read only memory can also be a PROM, i.e., a programmable read only memory, or an EEPROM, electrically erasable programmable read only memory. Preferably, the memory is an EEPROM, which is an easily changeable non volitile type memory. The content of a non volitile memory will be maintained although its power supply is interrupted for an extended period. Typically parameters for processing data and significant results of data manipulation such as instantaneous RMS, demand and peak demand current values can be stored in non volitile memory.

A control panel 50 is coupled to the microprocessor 48 and has a plurality of, namely eight, pushbutton switches 51-58. Each pushbutton switch 51-58 includes a pushbutton, one of which is shown in FIG. 1, and identified by the reference numeral 60 for connecting through a resistor 62 to the common neutral or ground 64 of the current metering machine 10. Again, although one pushbutton 60 and resistor 62 are shown in FIG. 1, each pushbutton switch 51-58 has a pushbutton 60 and resistor 62 associated therewith.

The multiplexer 40, the sample and hold circuit 42, the A/D converter 44 and the microprocessor 48 are all considered as comprising signal processing circuitry 70 for processing the analog signals received at the inputs 11, 12, 13 and 14.

Figure 2:
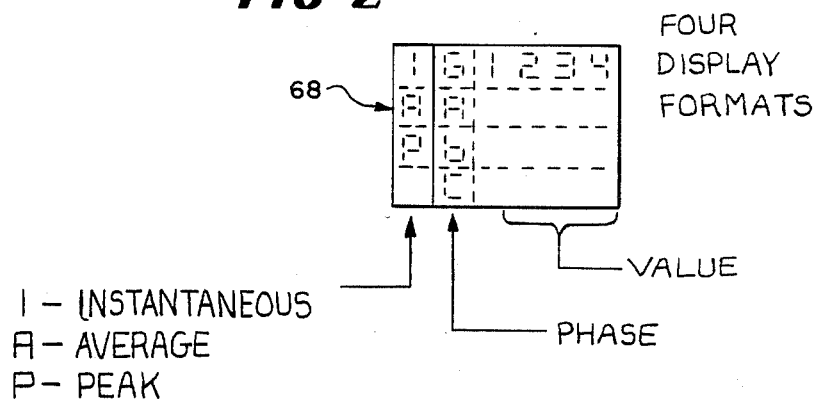
FIG. 2 is a view of the preferred visual display device to be used with the machine shown in FIG. 1 showing alternate display formats.

Also coupled to the microprocessor 48 is a visual display device 68 which is indicated as being of the the type which provides a light emitting diode (LED) display. The versatility of visual display device is illustrated in FIG. 2 by showing alternate formats for identifying the parameter value displayed. Other visual displays such as liquid crystal or flourescent displays could be used but are not regarded as being superior to LED type displays because of higher power demands or lower contrast. Six character digital displays can be presented with the display device 68. Each character in the display will be provided by LED segments which preferably are in a conventional 7 segment numeric character display arrangement. The first character for each row indicates the current parameter being metered for example instantaneous current I. The second character indicates the phase, whether it be phase A, B, C, or ground G. The next four characters indicate the value of the current parameter being metered.

The meter readout on the visual display device 68 is achieved by pressing one of the phase buttons 51-53 or the ground button 54 and the type of current button, 55 for instantaneous current, 56 for demand current or 57 for peak demand current, to obtain a readout of the particular current parameter desired. Reset button 58 clears the stored peak demand value from memory. Once a peak demand current is recorded by an operator, it need no longer be stored in machine memory. Activating reset button 58 clears the stored peak value and allows the recording of a new peak demand current in machine memory. The visual display device 68 and the microprocessor 48 will hold the current parameter display on the visual display device 68 for a short period of time after the respective button switches 51-57 are released.

Also it is contemplated that the visual display device 68 and the signal processing circuitry 70 may include cycling means circuitry and methods (not shown) for causing respective current parameters to be shown cyclically and continuously on the visual display device 68 and automatically updated. For example, the instantaneous RMS current, the demand current and the peak demand current for phase A could all be shown sequentially and held for a short period of time on the visual display device 68. Then, the same current parameters for the current in phase B would be shown for a short time and then so on to phase C and the ground phase. The control panel 50 and associated control circuitry would only be used to override the display being shown on the cycling visual display device 68 when it is desired to immediately meter another line.

Figure 3:
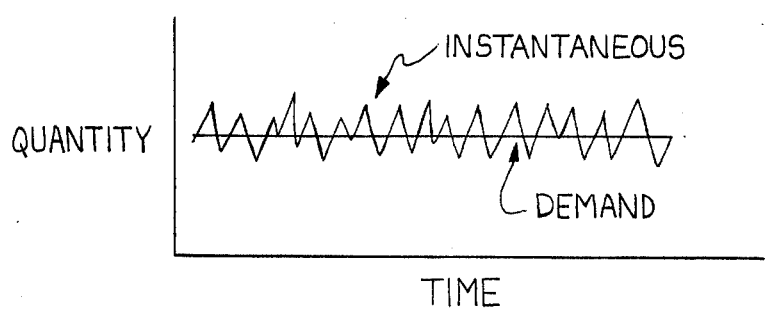
FIG. 3 is a graph of instantaneous current and demand current vs. time where the demand is substantially constant.

Referring now to FIG. 3 there is illustrated therein a graph of instantaneous current, namely the RMS value of the AC current flowing in a particular line, as it fluctuates over a period of time. Here, the RMS current fluctuations cancel so that the demand current is represented by a horizontal line.

Figure 4:
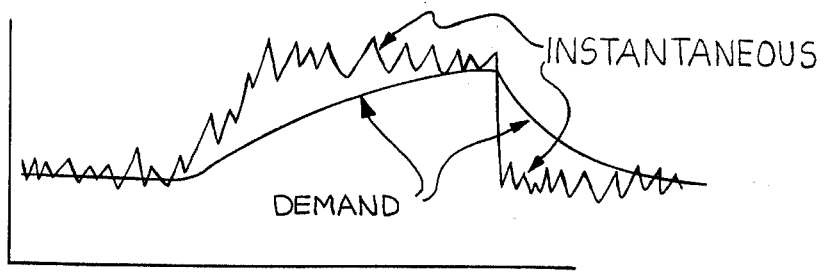
FIG. 4 is a graph of instantaneous current and demand current vs. time where there are significant changes in the demand current over a period of time.

FIG. 4 is a graph of instantaneous current and demand current vs. time where a large load is put on the line and then a large load is abruptly taken off the line. Here the demand current curve responds exponentially to the instantaneous RMS current corresponding to the thermal response of the distribution equipment.

The current metering machine 10 in processing analog input current signals received at inputs 11-14 and related to the line currents in lines A, B, C and G first conditions the analog current signals in the protection circuits 21-24. Then, the filtered currents are fed to the multiplexer 40. Assuming that the microprocessor 48 is one that does not have internal sample and hold and A/D converting circuitry, the output of the multiplexer 40 is fed to the sample and hold circuit 42 and then to the A/D converter 44.

The components such as the multiplexer 40, sample and hold 42, A/D converter 44 and microprocessor 48 are connected and programmed so that 16 instantaneous analog current amplitude values are sensed during each full cycle of the current waveform being measured. This current waveform has a fundamental frequency of 60 Hz. With 16 samplings per cycle per phase, this means that a sampling is done about every 260 microseconds.

The analog samples are converted by the A/D converter 44 to digital signals which are supplied to the microprocessor 48 and stored in a random access memory. The micrprocessor 48 is programmed to take samples for 32 consecutive cycles and then to reconstruct the fundamental wave from the amplitude values samples. In other words, the first sample per cycle for each of the 32 cycles are added together and divided by 32 to give an average first sample value and so on until 16 average sample values are obtained. Microprocessor 48 is programmed to apply a conventional waveform synthesis and analysis techniques such as a discrete Fourier analysis, of the type described in *Electrical Engineering Circuits* by H. H. Skilling published by John Wiley & Sons, Inc., New York, N.Y., 1957 to reconstruct the fundamental wave from the averaged sample. Of course, other waveform syntheses can be used such as those employing peak sensing and zero crossing detection.

Discrete Fourier analysis is used to determine the coefficient of the fundamental component of the alternating current waveform from which the instantaneous RMS value of the current for that phase is determined.

The micrprocessor 48 is programmed to determine a new instantaneous RMS current value every 10 seconds. The instantaneous RMS current is stored in memory from whch it may be retrieved on command. Once the instantaneous RMS current in a phase is determined, it is used to generate a new demand current value. The new demand current value is then also stored in memory for recall on request through control panel 50. If the new demand current value is larger than the peak demand current value stored for its phase, it replaces the stored peak demand current. The values of the demand current calculated approximate the exponential thermal response of electrical distribution equipment and in accordance with prior thermal electromechanical meters, reflect 90% of the ultimate demand current change fifteen minutes after a step change in instantaneous RMS current values.

The demand current value follows the instantaneous RMS current value with a smoothing effect and also a time delay. The graph in FIG. 4 shows the effect on demand current of a gradually changing instantaneous RMS current followed by a step decrease in instantaneous RMS current.

The concept of demand current is utilized in metering by electric utilities to eliminate the effects of short term rapid variations in a instantaneous RMS current which often fluctuates. This is done by using a means which will only slowly respond to changes in the instantaneous RMS current value. Typically an element with an effective ability to store energy (e.g. a thermal mass having a heat capacity or a capacitor) is used to obtain a desired time constant.

Two algorithms have been developed to generate this type of demand current value and can be referred to as a pseudo-exponential algorithm, and an exponential algorithm.

A pseudo-exponential algorithm that can be used by the microprocessor 48 is defined as follows:

$$I_{DO} + (I_i - I_{DO})1/N \rightarrow I_D$$

wherein $I_i$ = the new instantaneous RMS current $I_{DO}$ = the demand current stored at the start of the calculation N = a divisor related to averaging time and which fits the progression 2, 4, 8, 16, 32.

$I_D$ = the new demand current

→ = a programming symbol meaning the number determined to the left of the arrow is placed in or assigned to the symbol to the right of the arrow A timer associated with the microprocessor 48 calls up the pseudo-exponential algorithm on a regular basis for updating the determined value of demand current every 10 seconds. Next the stored demand current is fetched from memory with the instantaneous RMS current. Then, the instantaneous RMS current has the stored demand current subtracted from it and the result is divided by N. This quantity constitutes the change in the demand current required. The change is added to the stored demand current value to give the new demand current value which then replaces the stored demand current in memory.

The value of N is typically selected to make division by an N shift operation in the microprocessor program. The value of N and the frequency with which the algorithm is used determine the effective time constant of the response of demand to changes in instantaneous RMS current levels. The demand period, when the meter will reflect 90% of a step change of instantaneous RMS current, will often be between one and sixty minutes. The usual demand period is fifteen minutes. To obtain the fifteen minute demand period the value of demand is updated every 10 seconds and N is 32. It is more practical to change the frequency with which demand is updated than to change N. If a demand period of thirty minutes were desired, demand should be updated every 20 seconds.

A exponential algorithm that can be used by the microprocessor is an exact exponential. However, this algorithm requires multiplication or division operations, or both, that are time consuming in a digital format and may not be as preferable an algorithm as the pseudo-exponential algorithm. In any event, the digital exponential algorithm is defined as follows:

$$I_i + (I_{DO} - I_i)e^{-kt} \rightarrow I_D \tag{1}$$

wherein
$I_i$ = the instantaneous RMS current at start of an exponential calculation period $I_{DO}$ = the demand current at start of an exponential calculation period.

e = 2.72 k = a term related to the demand period.

t = a term proportional to the time since the last significant change in $I_i$, which increases each time this algorithm is run for a given $I_i$.

$I_D$ = the new demand current

→ = a programming symbol meaning the number determined to the left of the arrow is placed in or assigned to the symbol to the right of the arrow.

It is to be noted that kt becomes larger each time the algorithm is run and the term $e^{-kt}$ becomes smaller. If the quantity $I_i - I_{DO}$, namely the difference between the instantaneous and the demand currents is constant during an exponential calculation period, the term $e^{-kt}$ becomes vanishingly small. As a result, $I_D$ is only negligably different from $I_i$.

If, however, in this algorithm the new instantaneous current $I_i$ differs from the immediately previous instantaneous current $I_i$ by more than 1%, or some other significant selected amount, the value of t should be set to zero. The algorithm will thereafter continue to be applied to the digital current signal information from the new initial time. A value of k = 0.0003 will result in a fifteen minute demand period.

Figure 5:
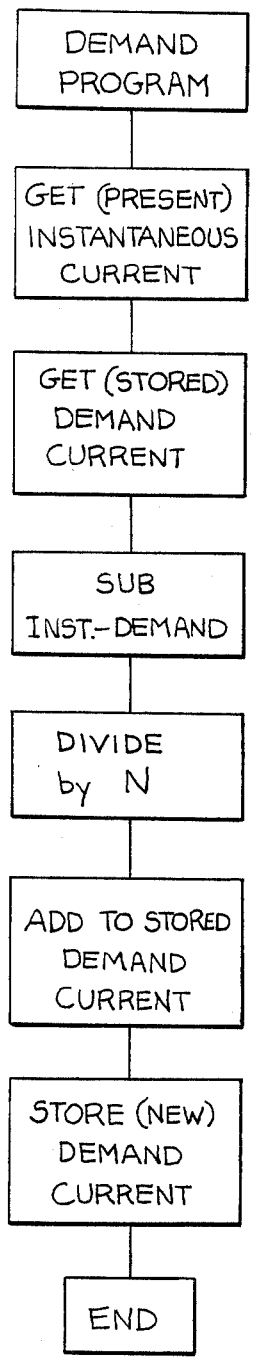
FIG. 5 is a condensed flowchart of the protocol or program carried out by the micrprocessor shown in FIG. 1 for determining demand current.

In FIG. 5 is illustrated a simplified flow chart of the demand program for the psuedo exponential algorithm implemented by the microprocessor 48. Here the demand program first obtains the new instantaneous RMS current value. As stated above, the instantaneous RMS current is determined for an average of 32 cycles with 16 samples per cycle. Then it obtains the demand current stored value. Next, it determines the difference between instantaneous RMS and demand currents and divides by N to determine the incremental change in demand current. The incremental change in demand is now added to the stored demand current and finally the new demand current is stored in the register for being recalled and displayed on the visual display 68. At the completion of the demand program the microprocessor 48 is available for other tasks.

Figure 6:
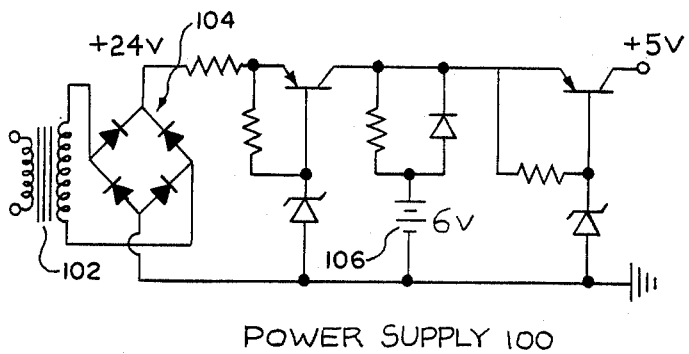
FIG. 6 is a schematic circuit diagram of the reserve backup battery powered power supply for the current measuring machine shown in FIG. 1.

In the event a volatile memory is utilized by the microprocessor 48, or to make certain that the metering machine 10 continues functioning when line voltage is lost such as when a power outage occurs, a reserve backup battery powered power supply 100 can be provided for the microprocessor 48 as is shown in FIG. 6. This power supply 100 includes a potential transformer 102 for picking up power from an AC line which could be a 120 volt consumer supply line. The output of the potential transformer 102 is supplied to a diode bridge circuit 104 which has a maximum voltage output of 24 volts to provide a trickle current charge to a six volt battery 106. This power supply then has an output of 5 volts and if power is lost across the bridge, a regulated 5 volt output is provided from the six volt battery until AC power is restored.

From the foregoing description it will be appreciated that the current metering machine 10 of the present invention provides an electronic current metering and readout of both instantaneous RMS current, demand current and peak demand current which have heretofore been provided by thermal demand meters. Empirical tests have shown that using the algorithms described above, particularly the psuedo exponential algorithm, provides a demand current value which is substantially the same as the demand current value obtained with a prior art thermal demand ammeter. However, the current metering machine 10 of the present invention provides a much simpler and less expensive means, apparatus or machine for providing a readout, in this case a digital readout, of not only demand current but also instantaneous current and peak demand current.

The circuitry and algorithms, above described, used to produce a current meter having instantaneous RMS current, demand current and peak demand current capabilities, may with slight modification be used to produce a voltage meter with analogous capabilities. The principal modification would be the substitution of potential trnasformers for current transformers. At present, such a demand voltage meter would not have as wide employment as the demand current meter. However, use of instantaneous RMS voltage values in conjunction with corresponding instantaneous RMS current values and the phase angle existing between them may be used to produce demand power meters. Such demand meters would in manner analogous to the above described current meter have capabilities in the instantaneous RMS power, demand power and, minimum and maximum demand power areas. The power values indicated could be either real, reactive or, apparent. Several modifications of the demand current meter, to enable it to indicate power, are all well within the skill of the art. A contemplated modification employs the method and circuitry disclosed in corresponding U.S. patent application Ser. No. 303,608 filed Sept. 18, 1981 by the present inventors, with others, and is also assigned to the McGraw-Edison Company. This application entitled "Smart Voltage Regulating Transformers" is hereby incorporated by reference. The phase current and voltage amplitudes are each alternately sampled 16 times each cycle for 32 cycles and averaged as above. The averaged current and voltage amplitudes are used to generate a Fourier transformed signal representing the line voltages and currents with an appropriate shift of $7\frac{1}{2}$ electrical degress to compensate for the difference between sample times. The Fourier transformed signals represent the instantaneous RMS voltage and current values with the phase angle relationship between them. These instantaneous RMS signals can be used to generate the demand voltage, current, and power values by an exercise of ordinary skill in light of this written description. For example, the instantaneous RMS current and voltage values could be multiplied to obtain apparent instantaneous RMS power. Using apparent instantaneous RMS power either the psuedo exponential or exponential algorithm could be used to obtain apparent demand power for each phase. If real or reactive power were desired, the initial multiplication need only include the appropriate trigonometric function value for the phase angle between the current and voltage. If reasonable assumptions concerning the relative constant value of phase voltages are made, multiplication of a demand current value by the instantaneous voltages would be a good approximation to demand power.

The method and machine of this invention may be employed for metering purposes above or, be employed in combination with existing power distribution control equipment. Where existing power distribution control equipment employs microprocessor means for control, little modification of the control method or equipment would be required to practice this invention as well as control functions. Such combined metering and control methods and equipment is envisioned by the inventors herein. In particular the present invention is expected to be employed with the invention described in the above incorporated "Smart Voltage Regulating Transformer".

It will be appreciated from the foregoing description that modifications can be made to the electric parameters metering machine and the method of utilizing same to obtain instantaneous RMS, demand and peak demand current, voltage or power without departing from the the teachings of the invention. Accordingly, the invention is only limited as necessitated by the accompanying claims. In these claims, a "selected algorithm" without further modification is meant to refer to the class of agorithms which mathematically approach the exponential heat dissipation formula set forth at (1).

We claim:

1. A method for metering electric parameters comprising the steps of: sensing the instantaneous analog amplitude value of an electric parameter waveform in at least one phase in a electric power distribution system at selected time intervals during each full cycle; converting the analog amplitude values to digital signals; storing the digital signals in a memory in, or associated with, signal processing circuitry to which the signals are supplied; applying a conventional waveform analysis technique to the digital signal information collected with respect to a selected number of cycles of the electric parameter waveform to obtain an instantaneous RMS value of the electric parameter; processing with a selected algorithm a sequence of instantaneous RMS electric parameter values at discrete time intervals to obtain a time averaged or demand electric parameter value; storing the instantaneous RMS and demand values of the electric parameter; and providing visual display means and control means coupled to the processing circuitry for enabling an operator to operate the control means to provide a readout of either the instantaneous RMS or demand electric parameter value.

2. The method of claim 1 including the steps of: continually sensing analog amplitudes of an electric parameter in two or more phases; multiplexing the analog amplitudes of the electric parameter; sequentially digitizing the multiplexed amplitudes of the electric parameter by sampling and holding the multiplexed amplitudes for a sufficient period for digitizing to be completed; storing the digitized amplitude values for each phase in signal processing memory for said selected number of cycles; and performing the remaining steps on each phase electric parameter to obtain readouts of the electric parameter for each phase.

3. The method of claim 1 further including the steps of: storing the demand electric parameter value in a peak area of memory; comparing the next value of the demand electric parameter with that stored in the peak area; and storing the larger of the two values of the demand electric parameter in the peak area of memory; and further enhancing said visual display means and control means to enable an operator to obtain a readout of a peak demand electric parameter value stored in the peak area of memory.

4. The method of claim 3 wherein the demand and peak demand electric parameter values are updated about every 10 seconds.

5. The method of claim 1 wherein said conventional waveform analysis technique is a discrete Fourier analysis which is utilized to determine the coefficients of the power line frequency fundamental sinusoidal wave of the electric parameter waveform for the electric parameter being measured.

6. The method of claim 1 wherein each digital amplitude signal associated with a selected time interval is summed into a selected area of said memory for said selected number of cycles; and divided by said selected number of cycles to obtain an averaged digital amplitude signal on a per cycle basis, before applying a conventional waveform analysis technique of a Fourier Transform variety, to obtain said instantaneous RMS electric parameter values.

7. The method of claim 1 wherein said processing of the instantaneous RMS electric parameter values at discrete time intervals includes the application of a pseudo-exponential algorithm to instantaneous RMS electric parameter values to obtain a demand values of the electric parameter.

8. The method of claim 7 wherein said pseudo-exponential algorithm is defined as follows:

$$P_{DO}+(P_i-P_{DO})1/N \rightarrow P_D$$

where
$P_i$=instantaneous RMS electric parameter value
$P_{DO}$=the stored demand electric parameter value
$P_D$=the new demand electric parameter value
N=a divisor related to averaging time which is a power of 2
$\rightarrow$ =a programming symbol meaning the number determined to the left of the arrow is placed in or assigned to the symbol to the right of the arrow.

9. The method of claim 8 including the steps of: continuously sensing analog amplitudes of current and voltage in at least one phase; multiplexing the analog amplitudes of current and voltage; sequentially digitizing the multiplexed amplitudes of current and voltage by sampling and holding the multiplexed amplitudes for a sufficient period for digitizing to be completed; storing the digitized amplitude values for current and voltage in signal processing memory for said selected number of cycles; applying a conventional waveform analysis technique to the digitized amplitude values to obtain instantaneous RMS values of current and voltage and their phase angle relationship; forming a power product of the instantaneous RMS current and voltage to obtain a instantaneous RMS power; and applying the remaining steps to the instantaneous RMS power to obtain a readout of the demand power.

10. The method of claim 8 wherein said discrete time interval is about 10 seconds and N is about 32.

11. The method of claim 7 wherein the pseudo-exponential algorithm is called up on regular intervals by a timer, associated with, or situated in, said processing circuitry, and a new demand electric parameter value is calculated by subtracting the stored demand electric parameter value from the instantaneous RMS electric parameter value and dividing by N to find the change in the demand electric parameter values and adding that change in demand electric parameter values to the stored demand electric parameter value to obtain the new demand electric parameter value.

12. The method of claim 1 wherein said processing of the instantaneous RMS electric parameter values at discrete time intervals includes the application of an exponential algorithm to the instantaneous RMS electric parameter values to obtain a demand values of the electric parameter.

13. The method of claim 12 wherein said exponential algorithm is defined as follows:

$$P_i+(P_{DO}-P_i)e^{-kt} \rightarrow P_D$$

where
$P_i$=instantaneous RMS electric parameter value at start of an exponential calculation period
$P_{DO}$=the stored electric parameter demand value at the start of an exponential calculation period
$P_D$=the new demand electric parameter value
e=2.72
k=a term related to the demand period
t=a term proportional to the time since the last significant change in $P_i$, which increases each time this algorithm is run for a given $P_i$
$\rightarrow$ =a programming symbol meaning the number determined to the left of the arrow is placed in or assigned to the symbol to the right of the arrow.

14. The method of claim 1 wherein the elctric parameter is current.

15. The method of claim 1 wherein sixteen instantaneous analog amplitude values of a electric parameter are sensed per cycle.

16. The method of claim 15 wherein a conventional waveform analysis technique is applied to the average of the instantaneous analog amplitude values obtained for 32 cycles of the electric parameter waveform to obtain the instantaneous RMS electric parameter.

17. The method of claim 1 wherein the value of the instantaneous RMS electric parameter is updated and stored about every 10 seconds.

18. The method of claim 1 wherein the demand period at the end of which the demand electric parameter value reflects 90% of a step change in the instantaneous RMS value is a time period between 1 minute and 60 minutes.

19. The method of claim 18 wherein the demand period is 15 minutes.

20. An electric parameter metering machine comprising: means for sensing the instantaneous analog amplitude value of an electric parameter waveform in at least one phase in an electric power distribution system at selected time intervals during each full cycle; means for converting the analog amplitude values to digital signals; signal processing circuitry including a memory for processing and storing the digital signals, said signal processing circuitry being operable to apply a conventional waveform analysis technique to the digital signal information collected with respect to a selected number of cycles of the electric parameter waveform to obtain an instantaneous RMS value of the electric parameter and being operable to process a sequence of instantaneous RMS electric parameter values at discrete time intervals to obtain time averaged or demand electric parameter values; memory for storing the instantaneous RMS and demand electric parameter values; and visual display means and control means coupled to said signal processing circuitry for enabling an operator to operate the control means to provide a digital readout of either the instantaneous RMS or the demand electric parameter value on said visual display.

21. The machine of claim 20 including means for obtaining instantaneous analog amplitude values of the electric parameter associated with two or more phases; means for multiplexing the analog electric parameter values for each phase; means for sampling and holding the multiplexed analog electric parameter values; means for sequentially converting instantaneous analog amplitude values to digital amplitude values and supplying the digital amplitude values to said signal processing circuitry for temporary storage in said memory for processing by said signal processing circuitry on a phase basis to obtain a readout of either the instantaneous RMS or the demand electric parameter value for each phase on said display.

22. The machine of claim 21 wherein all three phases and a ground phase in a power distribution system are coupled to said multiplexer means by protective input circuits which are isolated from each other.

23. The machine of claim 22 wherein each protective input circuit supresses transients with filter means having a time constant of about 1 millisecond and further provides protection against long term over-voltages by a double ZENER diodes.

24. The machine of claim 20 wherein said processing circuitry has a trickle charged battery-powered reserve power supply for energizing said signal processing circuitry during a power outage.

25. The machine of claim 20 further including, means for storing the demand electric parameter value in a peak area of memory; means for comparing the next value of the demand electric parameter with that stored in the peak area; means for storing the larger of the two values of the demand electric parameter in the peak area of memory; and means for recalling the stored value of demand electric parameter from the peak area of memory for display of a peak demand electric parameter value on said visual display.

26. The machine of claim 25 wherein said signal processing circuitry calculates and stores demand and peak demand electric parameter values about every every 10 seconds.

27. The machine of claim 25 wherein said control means include a control panel including pushbutton switches which are coupled to said processing circuitry and which include a button switch for each phase electric parameter to be measured and a button switch for causing either a instantaneous RMS demand or peak demand electric parameter value in a selected phase to be displayed on the visual display means.

28. The machine of claim 20 further including; means for storing the instantaneous RMS electric parameter value in a peak area of memory; means for comparing the next value of the instantaneous RMS electric parameter with that stored in the peak area; means for storing the larger of the two values of the instantaneous RMS electric parameter in the peak area of memory; and means for recalling the stored value of the instantaneous RMS electric parameter from the peak area of memory for display of a peak instantaneous RMS electric parameter value on said visual display.

29. The machine of claim 20 wherein said conventional waveform analysis technique is a discrete Fourier analysis which is applied by said signal processing circuitry to determine the coefficients of the power line frequency fundamental sinusoidal wave of the electric parameter waveform for the electric parameter being measured.

30. The machine of claim 20 further including a non volitile memory associated with said signal processing circuitry for storing process parameters and significant results of the process such as instantaneous RMS and demand values of the electric parameter.

31. The machine of claim 20 wherein said signal processing circuitry in processing the instantaneous RMS electric parameter values at discrete time intervals applies a pseudo-exponential algorithm to the instantaneous RMS electric parameter values to obtain demand values of the electric parameter.

32. The machine of claim 31 wherein said pseudo-exponential algorithm is defined as follows:

$$P_{DO}+(P_i-P_{DO})1/N \rightarrow P_D$$

where
$P_i$ = instantaneous RMS electric parameter value
$P_{DO}$ = the stored demand electric parameter value
$P_D$ = the new demand electric parameter value
N = a divisor related to averaging time which is a power of 2
$\rightarrow$ = a programming symbol meaning the number determined to the left of the arrow is placed in or assigned to the symbol to the right of the arrow.

33. The machine of claim 32 including means for continuously sensing analog amplitudes of current and voltage in at least one phase; means for multiplexing the analog values of current and voltage; means for sequentially digitizing the multiplexed amplitudes of current and voltage by employing sample and hold means for sampling and holding the multiplexed amplitudes for a sufficient period for digitizing to be completed; storage means for storing the digitized amplitude values of current and voltage for said selected number of cycles; means for applying a conventional waveform analysis technique to the digitized amplitude values to obtain instantaneous RMS values of current and voltage and their phase angle relationship, and for forming a power product of the instantaneous RMS current and voltage values to obtain a instantaneous RMS power value for obtaining a readout of demand power values from said instantaneous RMS power values.

34. The machine of claim 32 wherein said discrete time interval is about 10 seconds and N is about 32.

35. The machine of claim 31 wherein the pseudo-exponential algorithm is called up on regular intervals by a timer, associated with, or situated in, said processing circuitry, and a new demand electric parameter value is calculated by subtracting the stored demand electric parameter value from the instantaneous RMS electric parameter value and dividing by N to find the change in the demand electric parameter values and adding that change in the demand electric parameter values to the stored demand electric parameter value to obtain the new demand electric parameter value.

36. The machine of claim 20 wherein said signal processing circuitry in processing the instantaneous RMS electric parameter values at discrete time intervals applies an exponential algorithm to the instantaneous RMS electric parameter values to obtain a demand value of the electric parameter.

37. The machine of claim 36 wherein said exponential algorithm is defined as follows:

$$P_i + (P_{DO} - P_i)e^{-kt} \to P_D$$

where $P_i$ = the instantaneous current value at start of an exponential calculation period $P_{DO}$ = demand current value at start of an exponential calculation period $e = 2.72$ $k$ = a term related to the demand period $t$ = a term proportional to the time since the last significant change in $P_i$, which increases each time this algorithm is run for a given $P_i$ $\to$ = a programming symbol meaning the number determined to the left of the arrow is placed in or assigned to the symbol to the right of the arrow.

38. The machine of claim 20 wherein the electric parameters is current.

39. The machine of claim 20 wherein said signal processing circuitry is operable to sense about sixteen instantaneous analog amplitude values of a electric parameter per cycle.

40. The machine of claim 39 wherein said conventional waveform analysis technique is applied by said signal processing circuitry to the average of the instantaneous analog amplitude values obtained for about 32 cycles of the electric parameter waveform to obtain the instantaneous RMS electric parameter value.

41. The machine of claim 20 wherein said signal processing circuitry calculates and stores a new instantaneous RMS electric parameter value about every 10 seconds.

42. The machine of claim 20 wherein said signal processing circuitry calculates the demand electric parameter value so that the demand electric parameter value reflects 90% of a step change of instantaneous RMS electric parameter values in a time period of between 1 minute and 60 minutes.

43. The machine of claim 42 wherein said time period is 15 minutes.

44. The machine of claim 20 wherein said processing circuitry includes a microprocessor having A/D conversion means, random access memory means and read only memory means.

45. The machine of claim 20 wherein said visual display means include a light emitting diode display arrangement.

46. The machine of claim 20 wherein said visual display means includes a numeric 7 segment display for identifying the electric parameter.

* * * * *